United States Patent
Nalla et al.

(10) Patent No.: US 7,985,622 B2
(45) Date of Patent: Jul. 26, 2011

(54) METHOD OF FORMING COLLAPSE CHIP CONNECTION BUMPS ON A SEMICONDUCTOR SUBSTRATE

(75) Inventors: Ravi Nalla, Chandler, AZ (US); Islam Salama, Chandler, AZ (US); Charan Gurumurthy, Higley, AZ (US); Hamid Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 12/195,339

(22) Filed: Aug. 20, 2008

(65) Prior Publication Data

US 2010/0044862 A1 Feb. 25, 2010

(51) Int. Cl.
*H01L 21/44* (2006.01)
*B23K 31/00* (2006.01)

(52) U.S. Cl. ...................... 438/110; 228/179.1

(58) Field of Classification Search .................. None
See application file for complete search history.

(56) References Cited

U.S. PATENT DOCUMENTS

| | | | | |
|---|---|---|---|---|
| 5,251,806 | A * | 10/1993 | Agarwala et al. | 228/180.22 |
| 5,492,235 | A * | 2/1996 | Crafts et al. | 438/695 |
| 2006/0267176 | A1* | 11/2006 | Offrein et al. | 257/691 |
| 2009/0325379 | A1* | 12/2009 | Hlad et al. | 438/674 |

OTHER PUBLICATIONS

"Micro-Ball Bumpng Technology for Flip Chip and TAB interconnections", K. Tastsumi, K. Shimokawa, El Hashino, Y. Ohzeki, T. Nakamori and M. Tanaka; The International Jornal of Microcircuits and Electronic Packaging, vol. 22, No. 2, Second Quarter 1999.*
"An Application of Micro-Ball Wafer Bumping to Double Ball Bump for Flip Chip Interconnection"Kohei Tatsumi, 2005 Electronic Components andTechnology Conference.*

* cited by examiner

*Primary Examiner* — Charles D Garber
*Assistant Examiner* — Andre' C Stevenson
(74) *Attorney, Agent, or Firm* — Winkle, PLLC

(57) ABSTRACT

A method of forming collapse chip connection bumps on a semiconductor substrate is provided. The method includes providing a semiconductor substrate having a plurality of bump vias on a top surface of the semiconductor substrate and electroplating the plurality of bump vias to form a plurality of via pads on the top surface of the semiconductor substrate. The method also includes disposing a plurality of solder microballs on the top surface of the semiconductor substrate, wherein each solder microball is placed on a corresponding via pad on the semiconductor substrate and reflowing the plurality of solder microballs to form the collapse chip connection bumps on the semiconductor substrate.

16 Claims, 6 Drawing Sheets

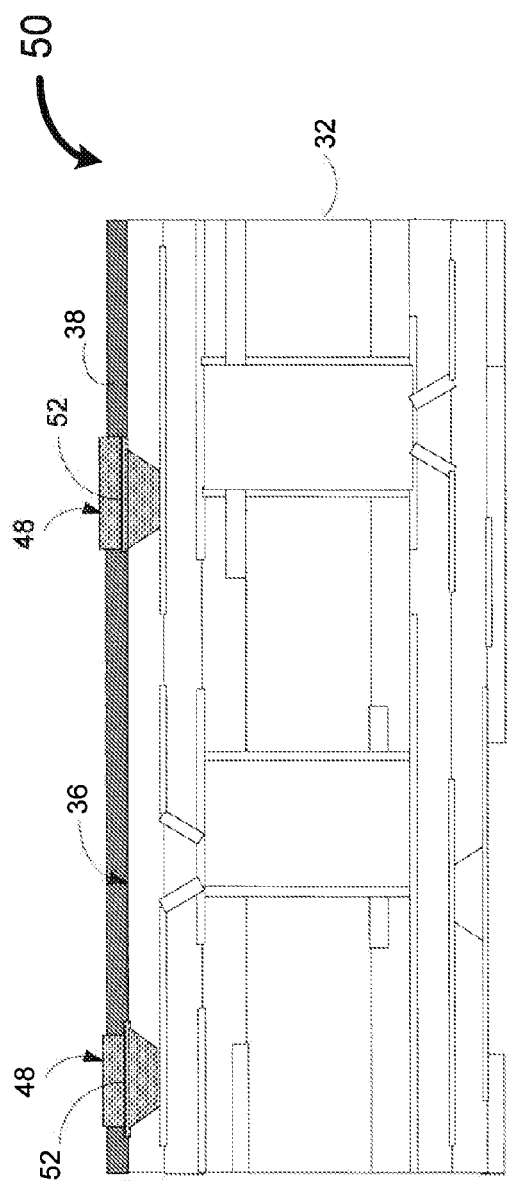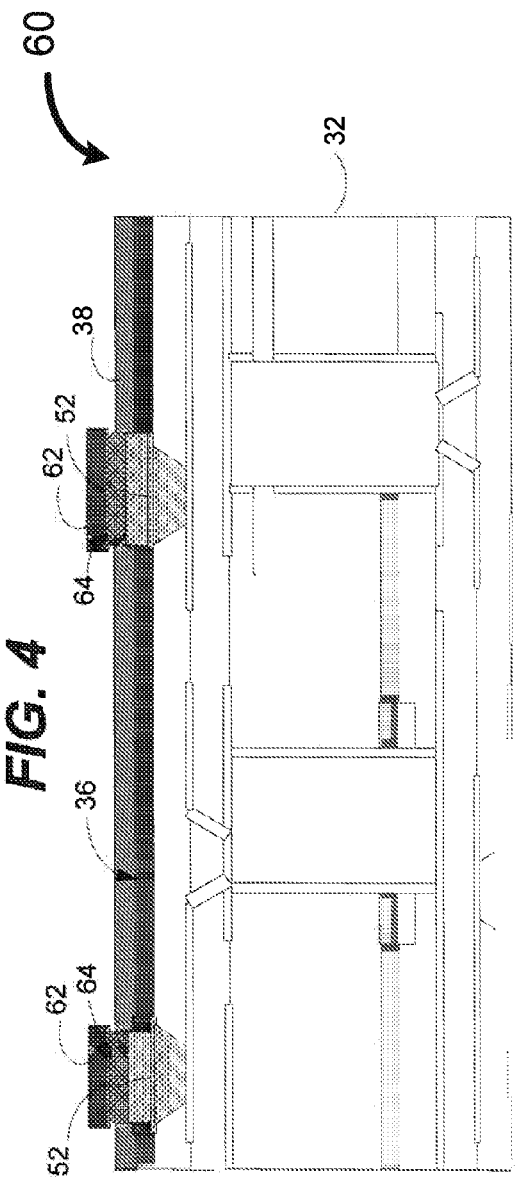

(12)United States Patent
US 7,985,622 B2

METHOD OF FORMING COLLAPSE CHIP CONNECTION BUMPS ON A SEMICONDUCTOR SUBSTRATE

BACKGROUND

Controlled collapse chip connection technique is typically employed to connect integrated circuits, or integrated circuit packages, or other such units to conductor strips or other like connections on substrates using solder bumps between surfaces of such units.

Various techniques are known for forming the solder bumps on the substrates. For example, paste printing technology may be employed to form the solder bumps. However, the bumps formed by this technique often have significant bump height variation, poor coplanarity and low volume solder bumps for ultra-fine pitch printing that results in chip attachment problems. Microball placement is an alternate technique for forming the solder bumps on the substrate. However, this technique may have geometric limitations dictated by opening they are placed on and can limit the bump height of the solder bumps.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 4 illustrates an exemplary configuration of the semiconductor substrate with a plurality of via pads in accordance with embodiments of present technique;

FIG. 5 illustrates an exemplary configuration of the semiconductor substrate with a flux material disposed on each of the plurality of via pads in accordance with embodiments of present technique;

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method of forming controlled collapse chip connection (C4) bumps on a semiconductor substrate. In particular, the present technique provides a technique to form relatively higher C4 bumps that allows for greater yield and denser routing. The controlled collapse chip connection bumps are to connect at least one integrated circuit to the semiconductor substrate.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
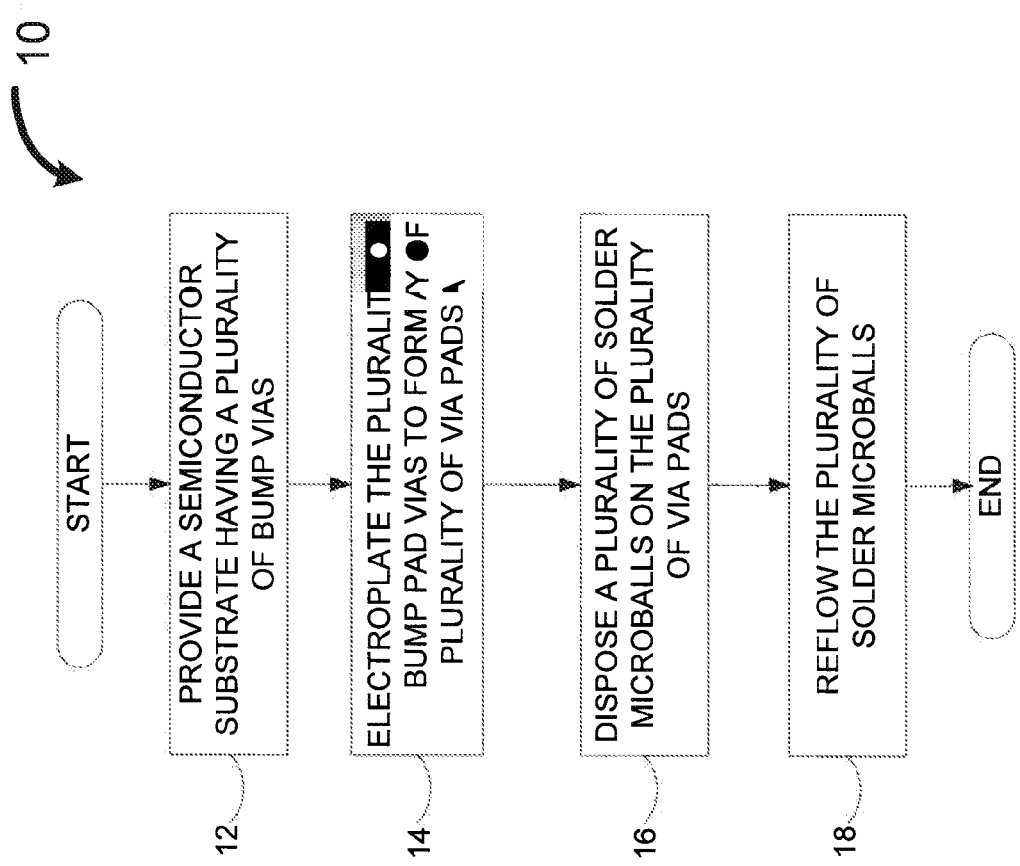
FIG. 1 illustrates a method of forming controlled collapse chip connection bumps is illustrated in accordance with embodiments of present technique.

Referring first to FIG. 1, a method 10 of forming controlled collapse chip connection bumps is illustrated. At block 12, a semiconductor substrate is provided. The semiconductor substrate may be formed of a variety of materials including ceramic and organic printed circuit boards. The semiconductor substrate includes a plurality of bump vias formed on a top surface of the semiconductor substrate. In certain embodiments, a solder resist layer is patterned on the top surface of the semiconductor substrate. Further, portions of the patterned solder resist layer are removed to form a plurality of solder resist openings (SROS) on the top surface of the semiconductor substrate. In one embodiment, a metal seed layer is electrolessly plated on the top surface of the patterned solder resist layer. In one exemplary embodiment, the metal seed layer includes copper. In another exemplary embodiment, the metal seed layer includes gold. In yet another exemplary embodiment, the metal seed layer includes silver. In yet another exemplary embodiment, the metal seed layer includes tin. However, a variety of other metals that can be electrolessly plated can be used for the metal seed layer.

Furthermore, a dry film resist (DFR) layer may be patterned on the metal seed layer and portions of the dry film resist layer may be removed to form the plurality of bump vias by isolating areas for further metal plating. At block 14, the plurality of bump vias are electroplated to form a plurality of via pads on the top solder resist surface of the semiconductor substrate, using the metal seed layer to provide electrical connectivity across the solder resist openings. In one embodiment, each of the plurality of bump vias is copper plated to form the plurality of pads. In yet another exemplary embodiment, the plating is done with tin or tin-based solder alloys, such as tin-silver or tin-copper alloys. However, a variety of other metals or alloys that can be electrolytically plated can also be used for filling the plurality of bump vias. Further, the dry film resist (DFR) layer and the underlying metal seed layer between the solder resist openings are then chemically stripped. As described above, electroplating is employed to fill the plurality of bump vias. In certain embodiments, electroless plating may be employed to fill the plurality of bump vias. Subsequently, any metal between the plurality of bump vias may be removed.

Further, at block 16, a plurality of solder microballs are disposed on the top surface of the semiconductor substrate. In this embodiment, each solder microball is placed on a corresponding via pad on the semiconductor substrate. In one embodiment, a flux material is applied on a top surface of each of the plurality of via pads. Further, the solder microballs are placed on the flux material of respective ones of the plurality of via pads. At block 18, the plurality of solder microballs are reflowed to form the controlled collapse chip connection bumps on the semiconductor substrate. In certain embodiments, the solder material of the microball includes an alloy such as, but not limited to, tin-silver or tin-copper alloys.

Figure 2:
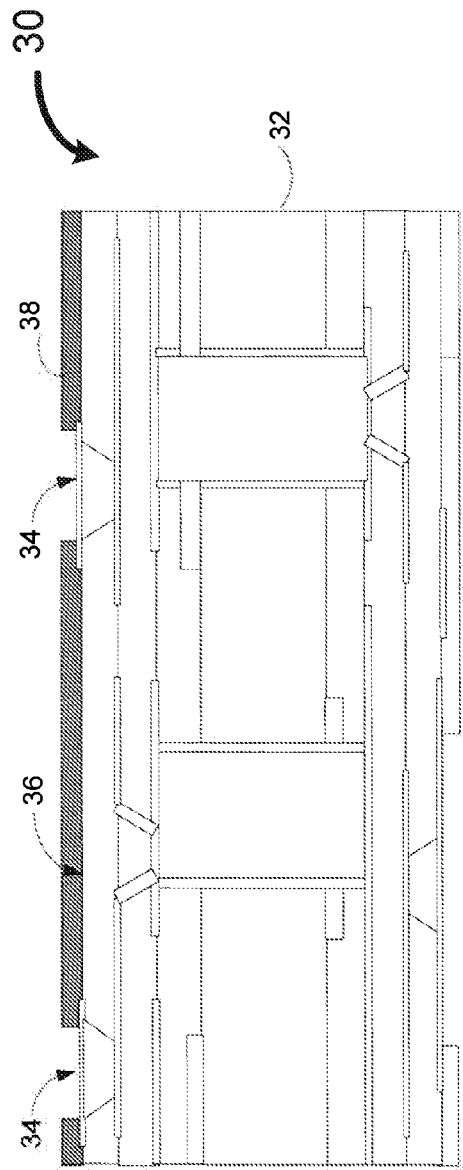
FIG. 2 illustrates an exemplary configuration of a semiconductor substrate with solder resist openings formed on a top surface of the semiconductor substrate in accordance with embodiments of present technique.

FIG. 2 illustrates an exemplary configuration 30 of a semiconductor substrate 32 with a plurality of solder resist openings (SROs) 34 formed on a top surface 36 of the semiconductor substrate 32. In operation, a solder resist layer 38 is patterned on the top surface 36 of the semiconductor substrate 32. Further, portions of the patterned solder resist layer 38 are removed to form the plurality of solder resist openings (SROs) 34 on the top surface 36 of the semiconductor substrate 32.

Figure 3:
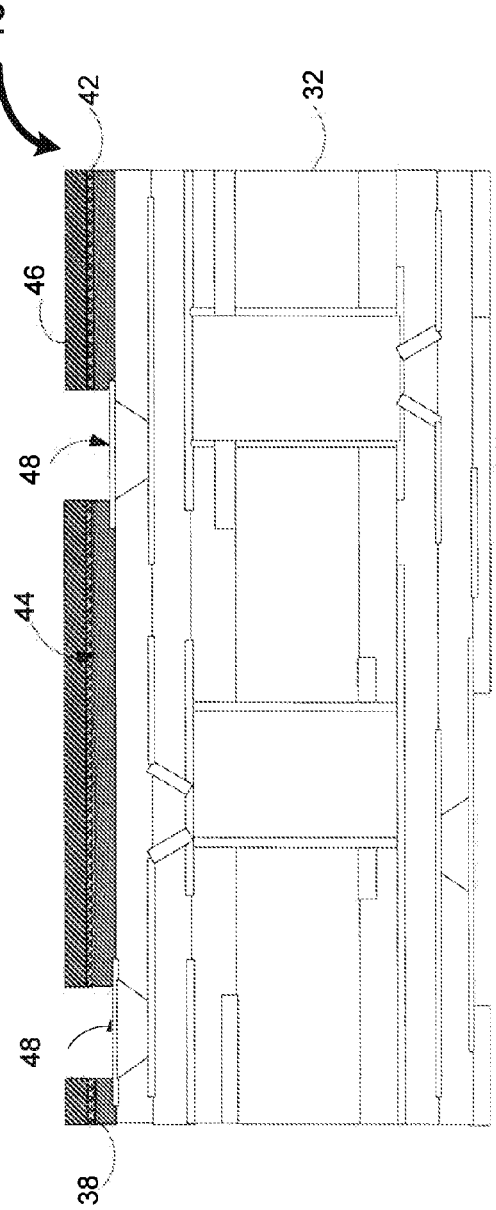
FIG. 3 illustrates an exemplary configuration of the semiconductor substrate with a metal seed layer disposed on a top surface of the patterned solder resist layer in accordance with embodiments of present technique.

FIG. 3 illustrates an exemplary configuration 40 of the semiconductor substrate 32 with a metal seed layer 42 disposed on a top surface 44 of the patterned solder resist layer 38. In this embodiment, the metal seed layer 42 is electrolessly plated on the top surface 44 of the patterned solder resist layer 38. In one exemplary embodiment, the metal seed layer 42 includes copper. In another exemplary embodiment, the metal seed layer 42 includes gold. In yet another exemplary embodiment, the metal seed layer 42 includes silver. In yet another exemplary embodiment, the metal seed layer includes tin. However, a variety of metals that can be electrolessly plated can be used for the metal seed layer 42. In one embodiment, a thickness of the metal seed layer 42 is between about 1 micrometer to about 2 micrometers. In this embodiment, the metal seed layer 42 is to electrically connect the plurality of solder resist openings 34 on the semiconductor substrate 32. In certain embodiments, an intermediate chemical treatment step may be performed to roughen surface of each of the plurality of solder resist openings 34 to facilitate adhesion of the metal seed layer 42.

In this exemplary embodiment, a dry film resist layer 46 is laminated and patterned on the metal seed layer 42. Further, portions of the patterned dry film resist layer 46 are removed to form a plurality of bump vias such as represented by reference numeral 48. In certain embodiments, a size of each of the plurality of bump vias may be greater than that of the underlying solder resist opening (SRO).

FIG. 4 illustrates an exemplary configuration 50 of the semiconductor substrate 32 with a plurality of via pads 52 formed on the semiconductor substrate. In this embodiment, each of the plurality of bump vias 48 are electroplated to form the plurality of via pads 52. In one embodiment, the plurality of bump vias 48 are copper plated. In yet another exemplary embodiment, the plating is done with tin or tin-based solder alloys, such as tin-silver or tin-copper alloys. In certain embodiments, the conditions for the electroplating are optimized to avoid large recesses that may impact subsequent processing. In certain embodiments, a desired surface finish coating may be plated on top of each of the plurality of bump vias 48 and/or the plurality of via pads 52. In one exemplary embodiment, nickel-palladium-gold (NiPdAu) may be plated on each of the plurality of bump vias 48. In another exemplary embodiment, electroless Nickel/Immersion gold and electrolytic gold (ENIG+EG) may be plated on each of the plurality of bump vias 48 and/or the plurality of via pads 52. In certain other embodiments, the desired surface finish coating may be plated on top pad surfaces 64 (see FIG. 5) of the via pads 52. Further, the dry film resist layer and the metal seed layer are removed.

FIG. 5 illustrates an exemplary configuration 60 of the semiconductor substrate 32 with a flux material 62 disposed on each top pad surfaces 64 of the via pads 52. In this exemplary embodiment, the flux material 62 is applied to remove any oxide on each of the plurality of the top pad surfaces 64 and potentially also to hold the microballs to be placed subsequently in place. In one embodiment, the flux material 62 is printed on each of the plurality of top pad surfaces 64 through a stencil mask. In another embodiment, the flux material 62 is printed through a mesh mask or sprayed on the plurality of top pad surfaces 64.

Figure 6:
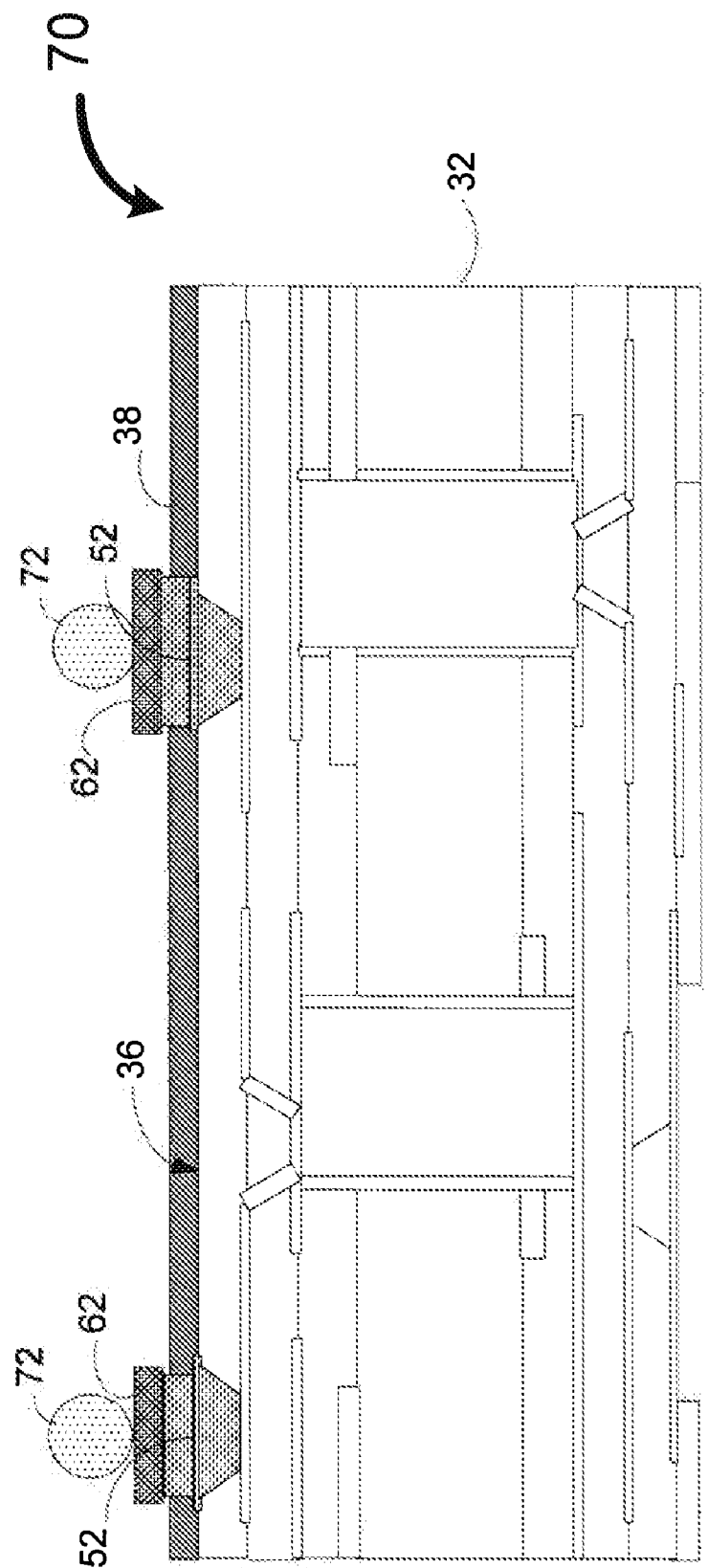
FIG. 6 illustrates an exemplary configuration of the semiconductor substrate with a plurality of solder microballs disposed on the plurality of via pads in accordance with embodiments of present technique.

Further, as illustrated in exemplary configuration 70 of FIG. 6, a plurality of solder microballs such as represented by reference numeral 72 are disposed on the plurality of top pad surfaces 64. In this embodiment, the solder microballs 72 are placed on the flux material 62 of respective ones of the plurality of top pad surfaces 64. A variety of known techniques may be employed to place the solder microballs 72 on the plurality of via pads 52. Exemplary placement techniques include, but are not limited to, squeezing through a ball placement mask, vacuum pick-and-place and through vibrational table. Further, a variety of solder materials may be used for the solder microballs 72. Exemplary materials include, but are not limited to, tin (Sn), tin-lead (Sn—Pb), tin-silver (Sn—Ag), tin-silver-copper (Sn—Ag—Cu).

Figure 7:
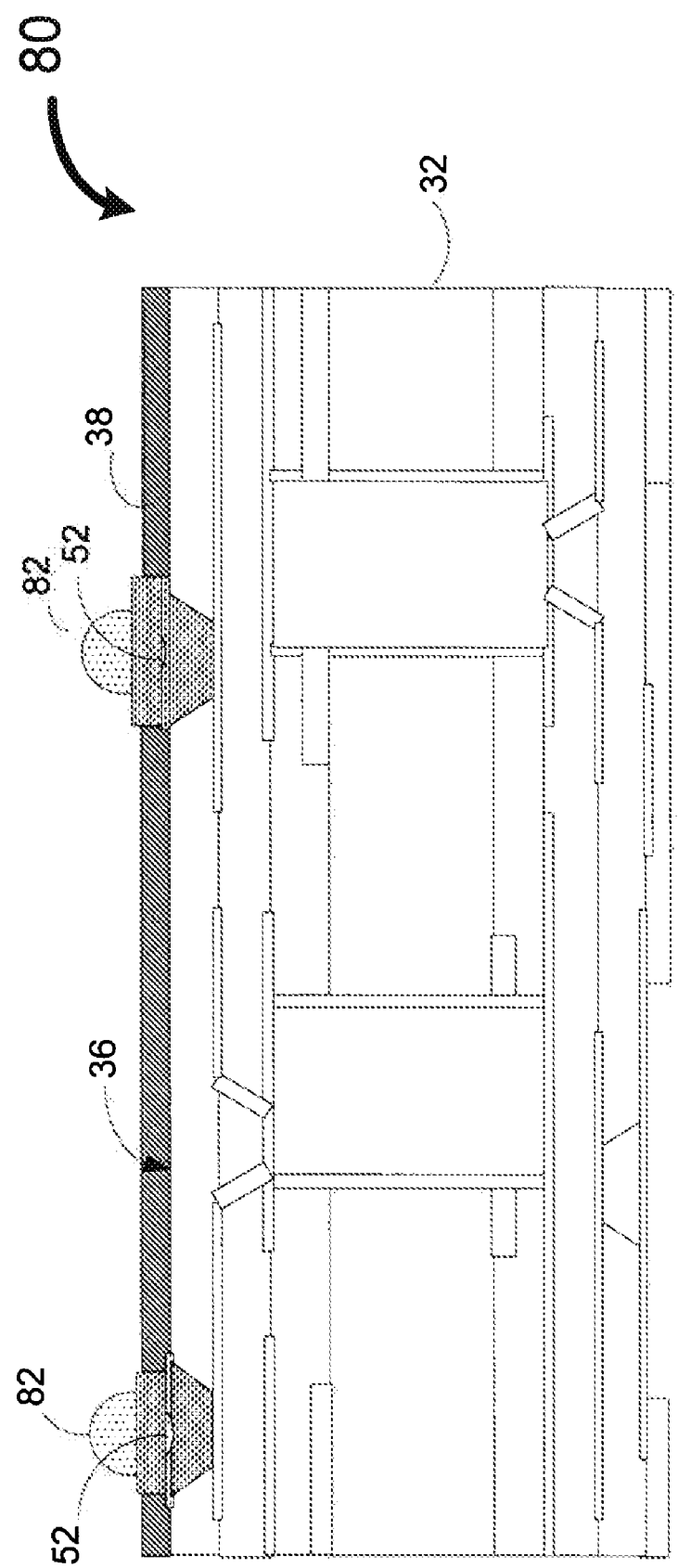
FIG. 7 illustrates an exemplary configuration of a microelectronic package with controlled collapse chip bumps formed on the semiconductor substrate in accordance with embodiments of present technique.

FIG. 7 illustrates an exemplary configuration 80 of a microelectronic package with controlled collapse chip bumps 82 formed on the semiconductor substrate 32. In this embodiment, the solder microballs 72 are reflowed to form the controlled collapse chip bumps 82. Further, the semiconductor substrate is cleaned and defluxed to form the microelectronic substrate 80.

In one embodiment, a height of the controlled collapse chip bumps 82 is between about 10 micrometers to about 75 micrometers. In one embodiment, a pitch of the controlled collapse chip bumps 82 is between about 50 micrometers to about 150 micrometers. In one exemplary embodiment, the pitch of the controlled collapse chip bumps 82 is about 130 micrometers. The controlled collapse chip bumps 82 may be employed to connect at least one integrated circuit to the microelectronic substrate 80.

The fabrication technique described in the embodiments above by plating the bump vias 48 and subsequently placing the solder microballs 72 on the top via pad surfaces 64 of the via pads 52 enables formation of relatively fine pitch controlled collapse chip bumps 82. Further, the technique facilitates relatively better height and void control of the bumps 82 and has improved process yield and/or denser routing. In one embodiment, a size of the bottom pad 52 for the microelectronic package may be reduced to about 50 micrometers as compared to a size of the bottom pad of about 80 micrometers for bumps formed by paste print or microball bumping. The reduced size of the bottom pad allows for coarser line/space and/or denser routing between the pads.

Thus, the technique described above provides a compliant first level interconnect (FLI) in the microelectronic package 80 that alleviates bump cracks and also shields the microelectronic package 80 from stresses introduced by the first level interconnect. Further, a variety of solder alloys may be employed for forming the interconnect.

Figure 8:
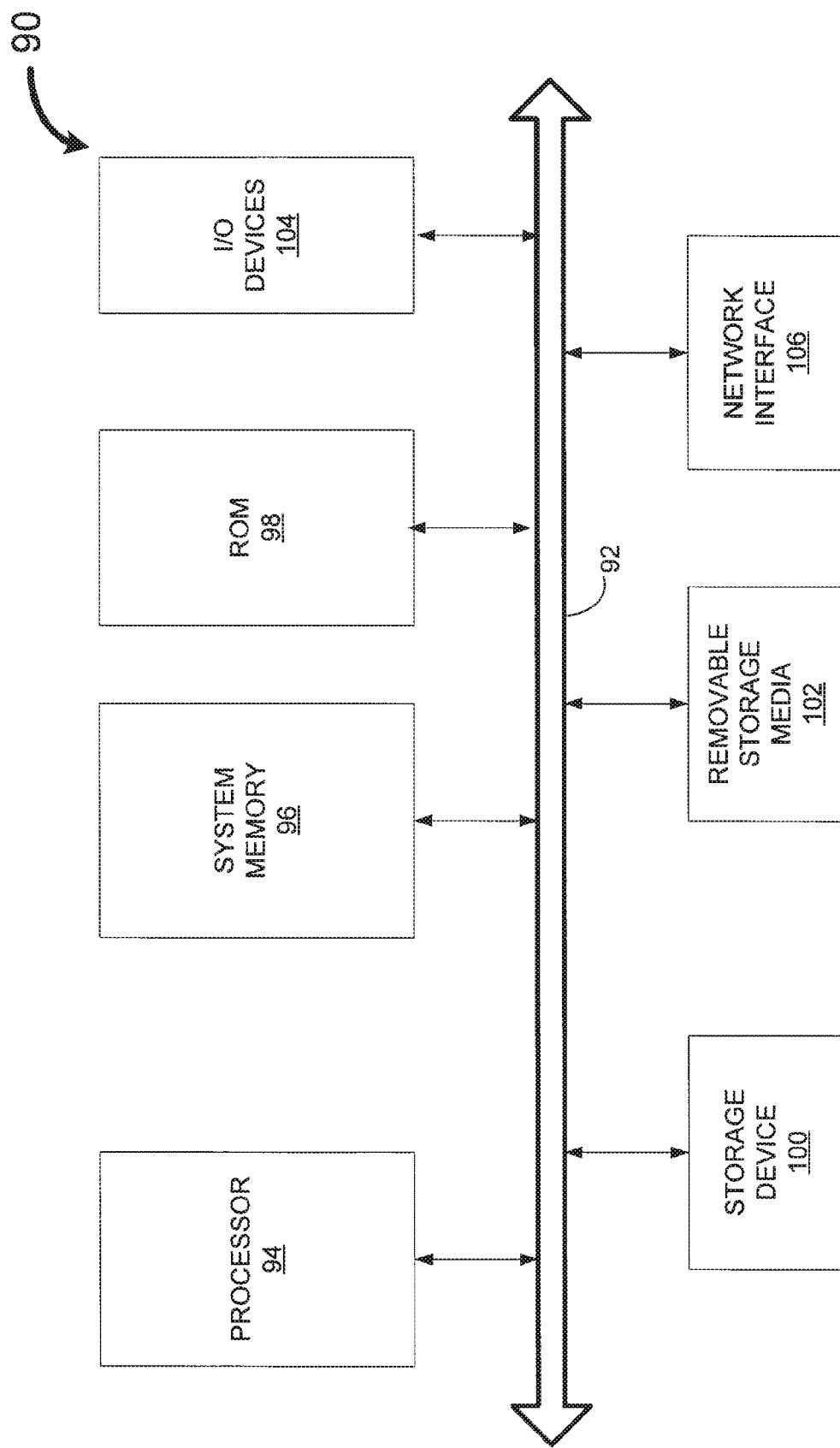
FIG. 8 illustrates an embodiment of a computer system in accordance with embodiments of present technique.

The microelectronic package 10 described above may be disposed in a computer system, a wireless communicator and a hand-held device. FIG. 8 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 8 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 98 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (HyperText Transmission Protocol, as well as others.

It should be understood that the computer system 90 illustrated in FIG. 8 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 8. The computer system 90 may comprise any type of computing device, such as a desktop computer, a laptop computer, a server, a hand-held computing device, a wireless communication device, an entertainment system etc.

In this embodiment, the computer system 90 may include the microelectronic package formed using the substrate 80 as described in the embodiments above. By way of example, the processor 94 may include a semiconductor substrate 80 and at least one integrated circuit. The at least one integrated circuit may be connected to the semiconductor substrate 80 through a plurality of collapse chip connection bumps 82. The plurality of collapse chip connection bumps include a plurality of via pads formed by electroplating a plurality of bump vias disposed on a top side of the semiconductor substrate and a plurality of solder microballs disposed on the top side of the semiconductor substrate, wherein each of the plurality of solder microballs is placed on a corresponding top surface of the pad of the semiconductor substrate.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method of forming collapse chip connection bumps on a semiconductor substrate, comprising:
   providing a semiconductor substrate having a plurality of bump vias on a top surface of the semiconductor substrate;
   patterning a solder resist layer on the top surface of the semiconductor substrate to form a patterned solder resist layer;
   removing portions of the patterned solder resist layer to form a plurality of solder resist openings on the top surface of the semiconductor substrate;
   electrolessly plating a metal seed layer on a top surface of the patterned solder resist layer;
   electroplating the plurality of bump vias to form a plurality of via pads on the top surface of the semiconductor substrate;
   disposing a plurality of solder microballs on the top surface of the semiconductor substrate, wherein each solder microball is placed on a corresponding via pad on the semiconductor substrate; and
   reflowing the plurality of solder microballs to form the collapse chip connection bumps on the semiconductor substrate.

2. The method of claim 1, further comprising:
   patterning a dry film resist layer on the metal seed layer; and
   removing portions of the dry film resist layer and the metal seed layer to form the plurality of bump vias.

3. The method of claim 1, wherein electroplating the plurality of bump vias comprises copper plating the plurality of bump vias.

4. The method of claim 1, comprising:
   applying a flux material on a top surface of each of the plurality of via pads; and
   placing the solder microballs on the flux material of respective ones of the plurality of via pads.

5. The method of claim 1, wherein a height of each of the bumps is between about 10 micrometers to about 75 micrometers.

6. The method of claim 1, wherein a pitch of the bumps is between about 50 micrometers to about 150 micrometers.

7. A method of forming controlled collapse chip connection bumps on a semiconductor substrate, comprising:
- forming a plurality of bump vias on a top surface of the semiconductor substrate;
- electroplating the plurality of bump vias to form a plurality of via pads on the top surface of the semiconductor substrate;
- patterning a solder resist layer on the top surface of the semiconductor substrate to form a patterned solder resist layer;
- removing portions of the patterned solder resist layer to form a plurality of solder resist openings on the top surface of the semiconductor substrate; and
- electrolessly plating a metal seed layer on a top surface of the patterned solder resist layer;
- disposing a plurality of solder microballs on the plurality of via pads, wherein each solder microball is placed on a corresponding via pad on the semiconductor substrate; and
- reflowing the solder microballs to form the controlled collapse chip connection bumps on the semiconductor substrate.

8. The method of claim 7, further comprising:
- patterning a dry film resist layer on the metal seed layer to form a patterned dry film resist layer; and
- removing portions of the patterned dry film resist layer to form the plurality of bump vias.

9. A microelectronic package, comprising:
- a semiconductor substrate,
- at least one integrated circuit; and
- a plurality of collapse chip connection bumps disposed on the semiconductor substrate, wherein the plurality of collapse chip connection bumps are to connect the at least one integrated circuit to the semiconductor substrate and wherein the plurality of collapse chip connection bumps comprise:
  - a plurality of via pads formed by electroplating a plurality of bump vias disposed on a top side of the semiconductor substrate; and
  - a plurality of solder microballs disposed on the top side of the semiconductor substrate, wherein each of the plurality of solder microballs is placed on a corresponding via pad of the semiconductor substrate;
  - a metal seed layer electrolessly plated on a top surface of each of the plurality of bump vias, wherein the metal seed layer comprises copper and wherein a thickness of the metal seed layer is between about 1 micrometer to about 2 micrometers.

10. The microelectronic package of claim 9, wherein each of the plurality of solder balls is reflowed to form the plurality of collapse chip connection bumps.

11. The microelectronic package of claim 9, wherein a height of each of the bumps is between about 10 micrometers to about 75 micrometers.

12. The microelectronic package of claim 11, wherein a pitch of the bumps is between about 50 micrometers to about 150 micrometers.

13. The microelectronic package of claim 9, wherein the plurality of via pads comprise copper.

14. The microelectronic package of claim 9, wherein the plurality of via pads comprise tin, or tin-based solder alloys.

15. The microelectronic package of claim 10, wherein the plurality of solder microballs comprise tin, or tin-based solders.

16. The microelectronic package of claim 10, further comprising a flux material disposed on a top surface of the plurality of via pads.

* * * * *